United States Patent [19]

Goeb et al.

[11] Patent Number: 4,633,487
[45] Date of Patent: Dec. 30, 1986

[54] AUTOMATIC PHASING APPARATUS FOR SYNCHRONIZING DIGITAL DATA AND TIMING SIGNALS

[75] Inventors: Robert Goeb, Spotswood; Nathaniel L. Silber, Cedar Grove, both of N.J.

[73] Assignee: ITT Corporation, New York, N.Y.

[21] Appl. No.: 691,978

[22] Filed: Jan. 17, 1985

[51] Int. Cl.[4] .............................................. H04L 7/04
[52] U.S. Cl. ................................ 375/118; 375/111; 307/516; 328/134
[58] Field of Search .................. 375/118, 111, 106, 4, 375/101; 328/134; 307/516

[56] References Cited

U.S. PATENT DOCUMENTS 4,408,333 10/1983 Fujii .................................... 375/111

Primary Examiner—Jin F. Ng
Assistant Examiner—M. Huseman
Attorney, Agent, or Firm—John T. O'Halloran; Jeffrey P. Morris

[57] ABSTRACT

There is disclosed an automatic phasing network which network receives a data signal and synchronous timing signals. Initially, these signals are in an arbitrary but fixed phase relationship to one another. The circuit establishes a fixed phase relationship between the data and timing signals with a large degree of resistance of phase jitter. In order to accomplish these results, the circuit operates to select the edge of the clock signals which is farthest from given data transitions and uses this edge to produce a data signal which is synchronized to the timing signal. The circuit provides an accurate phase relationship between the data and timing signals for various out-of-phase conditions as where the data transitions lag the rising edge of the clock by angles which vary between −45 degrees to +315 degrees.

21 Claims, 2 Drawing Figures

AUTOMATIC PHASING APPARATUS FOR SYNCHRONIZING DIGITAL DATA AND TIMING SIGNALS

BACKGROUND OF THE INVENTION

The Government has rights in this invention pursuant to Contract No. DAAB07-82-C-J155 awarded by the Department of the Army.

This invention relates to an automatic phasing circuit for digital data and timing signals and more particularly to a phasing network which can be utilized to synchronize a data signal with a timing signal in a digital communications system.

The fundamental consideration in the design of digital transmission systems involves defining certain time relationships between the individual transmission signals. The source terminal or transmitter transmits the individual signals using predetermined time relationships so that the receiving terminal or receiver can recognize each discrete signal as it arrives.

Invariably, the establishment of a proper time base at the receiver requires transmission capacity above that needed for the digital information itself. Over relatively short distances the timing information which is a system clock is usually distributed separately from the information bearing signals. Over long distances, however, it is more economical to incorporate the timing information into the signal format itself. In either case, the timing information requires channel capacity in terms of bandwidth, data rate or code operation.

In digital communications systems, timing inaccuracies occurring in either the transmitter or the receiver produce intersymbol interference. In the transmitter, timing inaccuracies cause interference if the rate of transmission does not conform to the ringing frequencies designed into the channel. Since timing in the receiver is derived from noisy and possibly distorted receive signals, inaccurate sample timings are more likely than inaccurate transmitter timings.

Essentially, it is preferable to utilize a synchronous transmission system where time received signals are synchronized to a system clock signal and are thereafter processed. There are many digital systems which employ asynchronous transmission. In any event, the major drawbacks of asynchronous transmission are its poor performance in terms of error rates on noisy lines and the relatively high overhead of transmission capacity for timing. It is a major problem in any digital transmission system to synchronize or phase the data in regard to system clock signals. It is, therefore, an object of the present invention to provide an automatic phasing network which network receives data and synchronous timing signals and establishes a fixed phase relationship between the signals.

The apparatus circuit to be described establishes a fixed phase relationship between the digital signals with a large degree of immunity to phase jitter. Phase jitter manifests itself as a repetitive shift in phase or frequency of the received signal. The impairment caused by phase jitter to data transmission depends on its magnitude and frequencies. Hence it is desirable to eliminate jitter or reduce phase jitter in order to achieve reliable data transmission.

BRIEF DESCRIPTION OF THE PREFERRED EMBODIMENT

An automatic phasing apparatus for establishing a fixed phase relationship between an incoming digital data signal and an input timing signal which signals are received have an arbitrary but fixed phase relationship therebetween, comprising first means responsive to said input timing signal for generating a synchronized timing signal having a greater repetition rate than said input timing signal, timing generator means having a first input responsive to said data signal and a second input responsive to said synchronized timing signal to provide an output thereof, first and second pulse signals with said first pulse signal indicative of a first given delay between a given transition of said data signal and said synchronized timing signal, and with said second pulse signal indicative of a second given delay, sampling means responsive to said first and second pulse signals for sampling said input timing signal according to said given delays to provide at an output a logic signal indicative of a transition of said input timing signal which is farthest delayed from said given transition of said data signal and output generating means responsive to said logic signal and said data signal to provide a regenerated data signal always having a fixed phased relationship to said input timing signals.

DETAILED DESCRIPTION OF THE FIGURES

Figure 1:
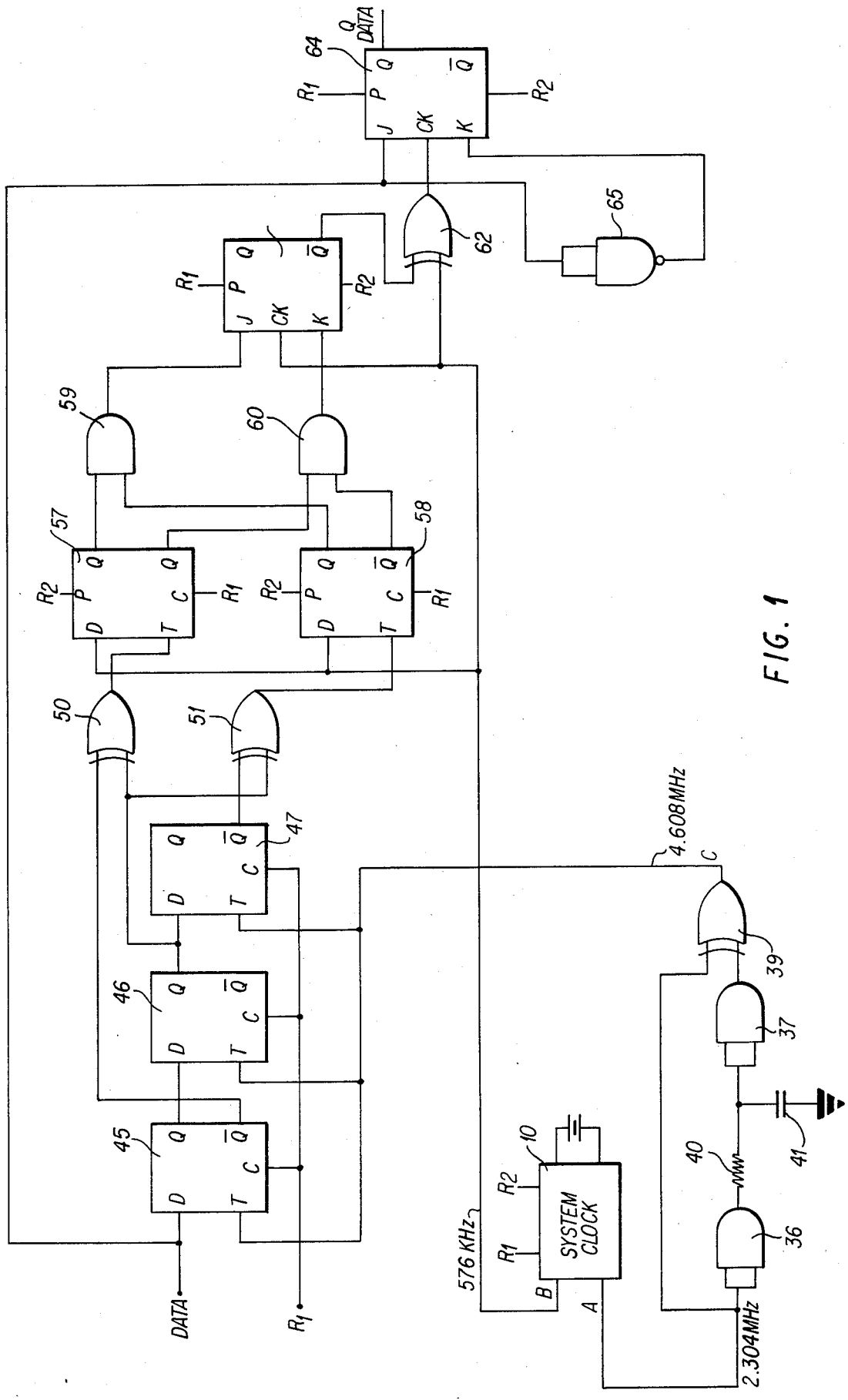
FIG. 1 is a detailed schematic diagram of an automatic phasing network according to this invention.

FIG. 1 is a circuit diagram depicting an automatic phasing circuit which will provide a fixed relationship between a received data signal and a timing signal.

Figure 2A:
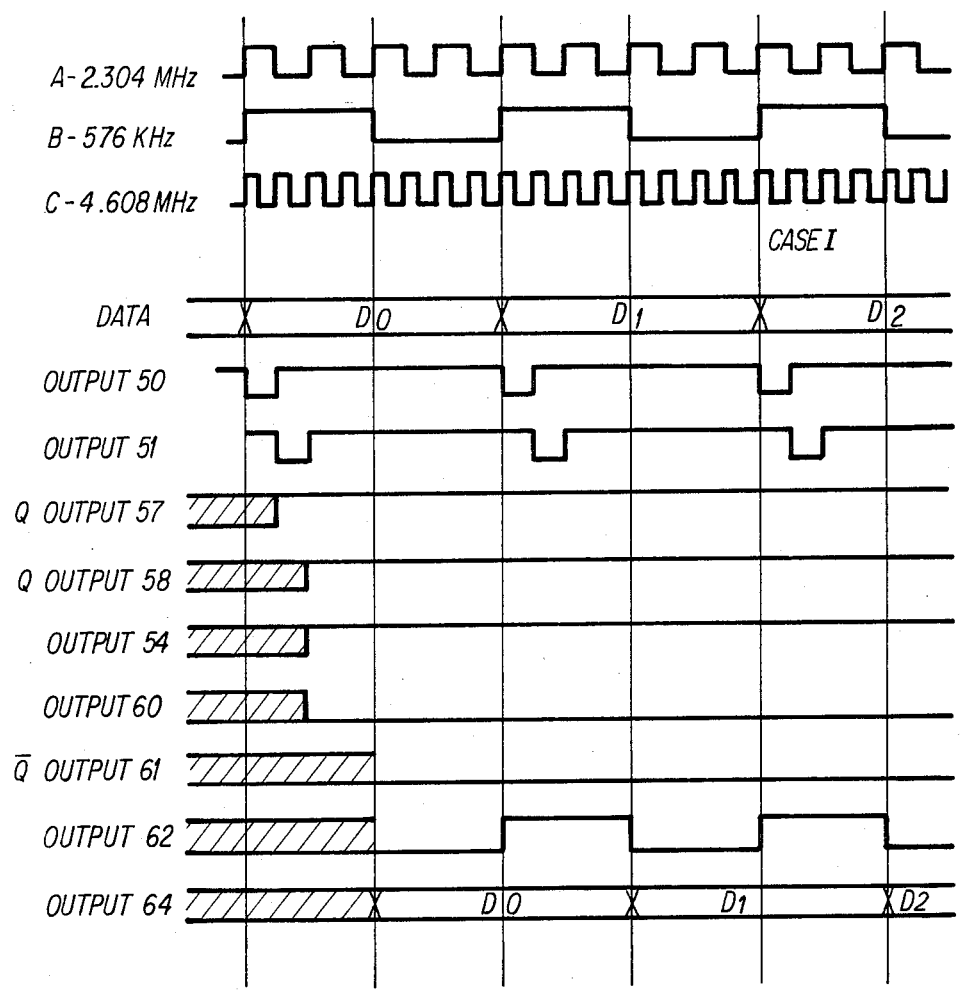
FIGS. 2A and 2B are a series of timing diagrams necessary to show the operation of the circuit of FIG. 1 and in particular describing three separate cases of different phase relationships between the data and timing signals.
Figure 2B:
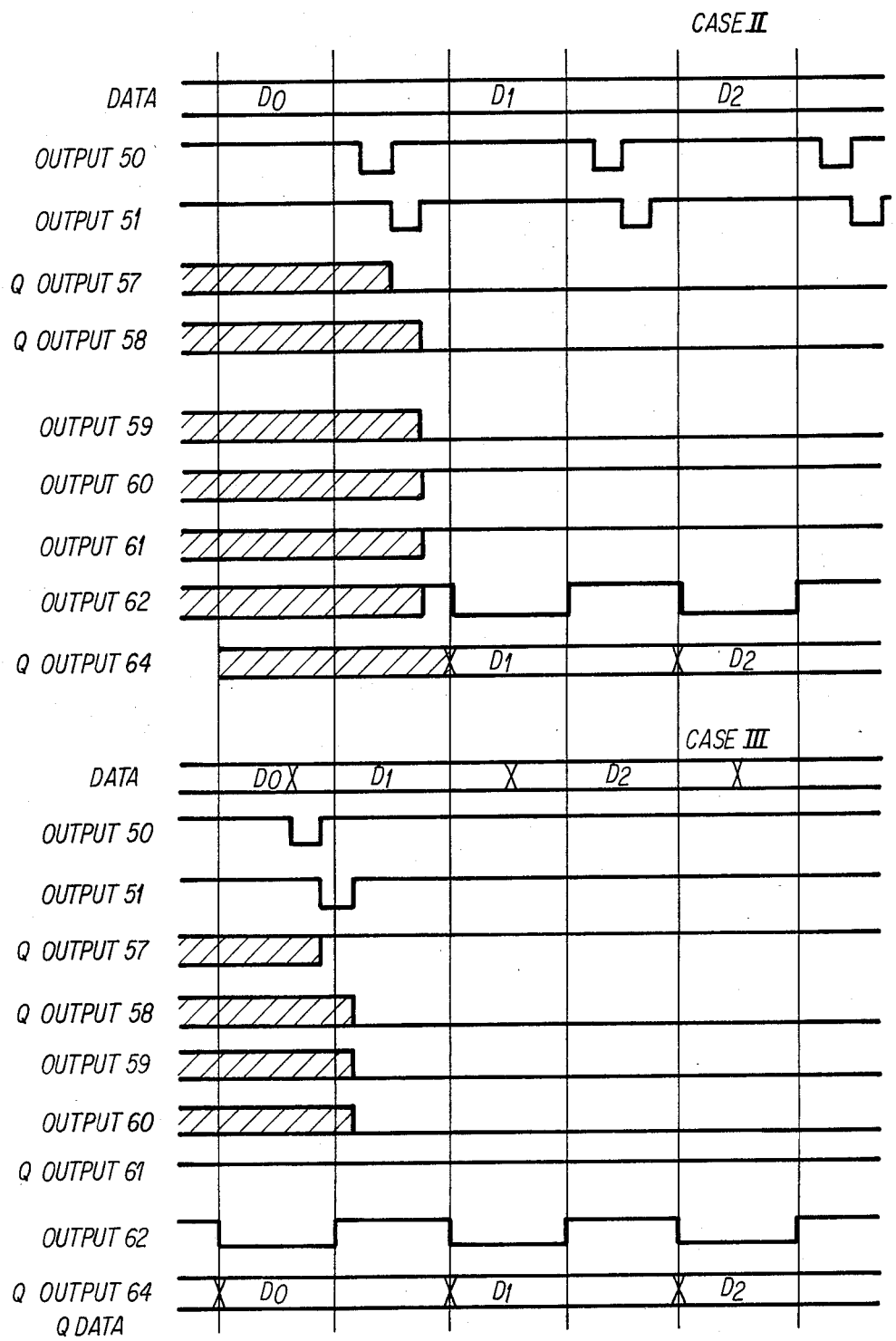

FIGS. 2A and 2B depict a series of timing diagrams which are necessary to explain the operation of the circuit shown in FIG. 1.

Referring to FIG. 1, there is shown a system clock 10. The clock 10 may be crystal controlled and hence provides extremely accurate output timing signals. The system clock 10 may include various frequency dividers such as cascaded chain of binary multivibrators or other such well known circuits to provide such multiple frequencies related to the system clock frequency.

The receiver clock 10 may be synchronized to the transmitter clock in a well known manner. As can be seen from FIG. 1, the system clock produces two frequencies which by way of example are a 2.304 MHz signal and a 576 KHz signal. As seen in FIGS. 2A and 2B, these signals are designated and shown on the timing diagrams as A and B. It is noted that the 2.304 MHz signal has a repetition rate which is four times greater than the 576 KHz signal. As will be explained, the circuit of FIG. 1 receives a data signal and the synchronous timing signals which are the 2.304 MHz signal and 576 KHz signals.

These signals are in an arbitrary but fixed phase relationship to one another. That is the data signal, and the timing signals bear a fixed but arbitrary phase relationship. This is a typical problem in many digital communications systems. The circuit of FIG. 1 operates to establish a fixed phase relationship between the signals with a large degree of resistance to phase jitter. As will be explained, this is accomplished by selecting for retiming purposes the edge of the clock which is farthest from the data transitions. The automatic phasing circuit as will be understood utilizes standard integrated circuit components to implement a network or circuit in which data transitions are used to sample the incoming timing signal.

A logic circuit uses this information to determine which edge of the incoming timing signal is farthest from the data transition. Thus referring back to FIG. 1, the system clock 10 may be located at the transmitter site or at a site remote from the circuitry of FIG. 1, and hence the A and B signals are the input timing signals to the circuit shown in FIG. 1.

As seen from FIG. 1, a digital data signal and the synchronous timing signals A and B are inputed to the automatic phasing network. The A signal which is at 2.304 MHz rate is synchronous to the B signal at 576 KHz and is four times its rate as indicated above. This is shown in the timing diagram of FIGS. 2A and 2B. The A signal is inputed to a frequency doubler circuit consisting of AND gates 36, 37 with exclusive OR gate 39. Essentially, the input to AND gate 36 which is a buffer is the A signal. The output of the AND gate is coupled via a resistor 40 and a capacitor 41 arranged in an integrator configuration. The junction between resistor 40 and capacitor 41 is coupled to the input of buffer gate 37 having its output coupled to one input of the Exclusive OR gate 39.

The other input to the Exclusive OR gate 39 is connected directly to the A signal source. Thus at the output of gate 39, there is provided a 4.608 MHz signal shown in FIG. 2A as waveform C. This signal is applied to the T input of three cascaded D type flip flops 45, 46 and 47 arranged as a shift register. D type flip flops are a well known circuit configuration. A D type flip flip can be implemented so that it operates on either the leading or trailing edge of the input clock signal which is the signal applied to the T or trigger input. As indicated, such flip flop configurations are well known and examples of suitable flip flops are commercially available from many manufacturers in integrated circuit form. For particular examples of such, see a text entitled PRACTICAL GUIDE TO DIGITAL INTEGRATED CIRCUITS by A. W. Barber. Parker Publishing Company, Inc. (1976), Chapter 4.

The D type flip flops 45, 46 and 47 comprise a 3-bit shift register which is used to generate timing signals as will be explained in conjunction with the timing diagrams of FIGS. 2A and 2B. There are three operations which are implemented by the circuit of FIG. 1 and which depend on the data and timing phase relationship.

Referring to FIG. 2A, a first set of conditions is indicated as case I. As seen from FIG. 2A, the data input which consists of bits D0, D1 and D2 . . . etc. exhibit transitions which lag the rising edge of the clock by −45 degrees to +90 degrees. As seen from FIG. 1, coupled to the $\overline{Q}$ output of flip flop 45 is one input of an Exclusive OR gate 50. The other input of gate 50 is coupled to the Q output of flip flop 46. A second Exclusive OR gate 51 has one input coupled to the $\overline{Q}$ output of flip flop 47 with the other input to OR gate 51 coupled to the Q output of flip flop 46.

As seen in FIGS. 2A and 2B, the outputs of gates 50 and 51 are shown beneath the data timing diagram. Essentially, the Exclusive OR gate 50 generates a pulse which is one 4.608 MHz clock period after the data transition. The output of the Exclusive OR gate 51 generates a pulse which is two 4.608 MHz clock periods after the data transition. These two pulses are used to sample the 576 KHz clock. The output of the Exclusive OR gate 50 is coupled to the T input of a D flip flop 57, while the output of the Exclusive OR gate 51 is coupled to the T input of a D flip flop 58. The D inputs of flip flops 57 and 58 are coupled to the B clock at 576 KHz, which is to be sampled by the pulses.

The flip flops 57 and 58 function to hold or store the respective samples which are generated by the output pulses from gates 50 and 51. In the case shown above, both samples are at logic 1. This can be seen from FIGS. 2A and 2B, where the outputs of flip flops 57 and 58 are shown. The Q outputs of flip flops 57 and 58 are coupled to a first AND gate 59 with the $\overline{Q}$ outputs of flip flops 57 and 58 coupled to the inputs of a second AND gate 60. The output of AND gate 59 is coupled to the J input of a JK flip flop 61 with the output of AND gate 60 coupled to the K input of flip flop 61. The clock input of flip flop 61 is coupled to the B signal or the 576 KHz signal. The $\overline{Q}$ output of flip flop 61 is coupled to one input of an Exclusive OR gate 62 having its other input coupled to the 576 KHz clock. The output of the Exclusive OR gate 62 is coupled to the clock input of a JK flip flop 64 with the J input of 64 coupled to the data input line. An inverter gate 65 also receives the data input and has its output coupled to the K input of flip flop 64. The Q output of flip flop 64 provides the fixed data signal as shown in FIGS. 2A and 2B.

As can be seen from FIG. 2A, during the case I condition, the flip flops 57 and 58 hold the respective samples as controlled by gates 50 and 51 of the timing clock B, these outputs are both at logic 1. This causes AND gate 59 to go to logic 1, and AND gate 60 to go to logic zero. On the next falling edge of the 576 KHz signal the JK flip flop 61 is set causing its $\overline{Q}$ output to go to zero. The exclusive OR gate 62 passes the 576 KHz signal un-inverted. The inverter gate 65 and the JK flip flop 64 are configured as a negative edge triggered D flip flop. Thus the addition of the inverter gate 65 having its output coupled to the K input of flip flop 64 manifests a D type flip flop operation which is a negative edge triggered device. In this manner the output of flip flop 64 as having its clock input coupled to the output of gate 62 samples the data signal on the falling edge to produce a known data timing phase relationship shown in FIG. 2A as the Q output of flip flop 64. Hence as can be seen from FIG. 2A, in case I, the output 64 provides a data output which is synchronized to the falling edges of the B clock.

Again, referring to FIG. 2B, there is another set of conditions designated as case II. In this case the data signal is again shown and the data transitions lag the rising edge of the clock signal by +135 degrees to +270 degrees. As shown on the timing diagram of FIG. 2B for case II, the pulses generated by gates 50 and 51 sample the clock. The Q outputs of flip flops 57 and 58 both are zero. This causes gate 59 to go low and gate 60 to go high. On the next falling edge of the B clock (576 KHz), the $\overline{Q}$ output of flip flop 64 goes high. This in turn causes gate 62 to pass the 576 KHz clock inverted. The output of gate 62 samples the data signal on the falling edge again producing a known data timing relationship as shown by the Q output 64 for case II. It is seen that in Case II, the data transitions are again synchronized to the falling edge of the B clock.

Referring back to FIG. 2B, there is shown a series of timing diagrams for case III. In this case the data transitions lag the rising edge of the clock by +90 degrees to +135 degrees or +270 degrees to +315 degrees. In this case, both edges of the B clock are equally appropriate to retrieve the data signal. The outputs of flip flops 57 and 58 are unequal as shown in the timing diagrams for case III. The outputs of gates 59 and 60 are both zero. In this manner, the output of flip flop 61 retains its last state. As can be seen during the condition specified by the timing diagrams for case III, hysteresis is introduced into the system in such a manner that the back-to-back phase jitter between the clock and data signals must exceed 45 degrees or ⅛ of a bit before bit errors can result. The system has the following advantages in that it is fully digitally implemented and hence minimizes circuit variations due to temperature and component tolerences.

The addition of the third case of conditions which is case III to the phase selection process increases the ability of the system to withstand data timing phase jitter without causing significant bit errors in retrieving the data.

As indicated above and as can be seen from FIG. 1, all components are conventional integrated circuits which are available in TTL MSI designs and configurations. The circuit described thus utilizes such circuitry so that data transitions are used to sample the incoming timing signal and the circuit uses this information to determine which edge of the incoming timing signal is farthest from the data transitions. In this manner, a data signal is always provided which is in a strict phase relationship with the timing signal and which exhibits a large degree of resistance to phase jitter due to circuit operation.

We claim:

1. An automatic phasing apparatus for establishing a fixed phase relationship between an incoming digital data signal and a first and a second input timing signal which signals as received have an arbitrary but fixed phase relationship therebetween, comprising:

first means responsive to said first input timing signal for generating a synchronized timing signal having a greater repetition rate than said first input timing signal, timing generator means having a first input responsive to said data signal and a second input responsive to said synchronized timing signal to provide at an output, thereof, first and second pulse signals with said first pulse signal indicative of a first given delay between a given transition of said data signal and said synchronized timing signal, and with said second pulse signal indicative of a second given delay, between said data and said synchronized timing signal sampling means responsive to said first and second pulse signals for sampling said second input timing signal within a single cycle according to said given delays to provide at an output a logic signal indicative of a transition of said second input timing signal which is farthest delayed in time from said given transition of said data signal and output generating means responsive to said logic signal and said data signal to provide a regenerated data signal always having a fixed phase relationship to said first and second input timing signals.

2. The apparatus according to claim 1, wherein said first means responsive to said first input timing signal comprises a frequency multiplier having an input responsive to said first input timing signal for providing at an output said synchronized timing signal at a given multiple of the repetition rate of said first input timing signal.

3. The apparatus according to claim 2, wherein said given multiple is eight times the repetition rate of said first input timing signal.

4. The apparatus according to claim 3, wherein said first input timing signal is at 2.304 MHz rate, said second input timing signal as at a 576 KHz rate and said synchronized timing signal is at a 4.608 MHz rate.

5. The apparatus according to claim 1, wherein said timing generator means includes a multiple stage shift register having a first input for receiving said digital data signal and a second input for receiving said synchronized timing signal.

6. The apparatus according to claim 5, wherein said timing generator means further includes first and second exclusive OR gates each having inputs coupled to said shift register for providing at outputs said first and second pulse signals.

7. The apparatus according to claim 6, wherein said shift register is a three stage shift register consisting of three D type flip flops having D and T inputs, with the D input of the first stage flip flop adapted to receive said data signal and with the T inputs of said flip flops adapted to receive said synchronized timing signal.

8. The apparatus according to claim 1, wherein said sampling means includes first and second flip flops with said first flip flop responsive to said first pulse signal and with said second flip flop responsive to said second pulse signal, with each flip flop further coupled to said second input timing signal to store in each of said flip flops said logic signal.

9. The apparatus according to claim 8, further including first and second AND gates each having two inputs, with the inputs of said first gate coupled to one output of each of said first and second flip flops and with the inputs of said second gate coupled to the other output of said first and second flip flops.

10. The apparatus according to claim 9, wherein said first and second flip flops are D type flip flops having D and T inputs, with the D inputs coupled to said second input timing signal and with the T inputs separately responsive to one of said first and second pulse signals.

11. The apparatus according to claim 9, wherein said output generating means includes a first flip flop having one input coupled to the output of said first AND gate and a second input coupled to the output of said second AND gate, and having a clock input coupled to said second input timing signal.

12. The apparatus according to claim 11, wherein said first flip flop of said output generating means is a J-K flip flop having the J input coupled to the output of said first AND gate and the K input coupled to the output of said second AND gate, with the clock input of said J-K flip flop coupled to said second input timing signal.

13. The apparatus according to claim 12, further including an exclusive OR gate having one input connected to the $\overline{Q}$ output of said J-K flip flop and one input coupled to said second input timing signal and having an output coupled to the clock input of a second flip flop, with said second flip flop having first and second inputs coupled to said input data signal.

14. The apparatus according to claim 13, wherein said second flip flop is a J-K flip flop with said J input coupled to said data signal and with said K input adapted to receive an inverted version of said data signal, with the clock input coupled to the output of said Exclusive OR gate, for providing at the Q output of said second flip flop said regenerated data signal.

15. The apparatus according to claim 14, further including an inverter having an input adapted to receive said data signal for providing an inverted data signal at said output which output is connected to said K input of said second flip flop.

16. The apparatus according to claim 1, wherein said arbitrary but fixed phased relationship between said data and first and second timing signals varies between −45 degrees to +90 degrees in a first case of conditions.

17. The apparatus according to claim 16, wherein the data transitions lag the rising edge of said second timing signal transitions by said given phase degree ranges.

18. The apparatus according to claim 1, wherein said arbitrary but fixed phase relationship varies between +135 degrees to +270 degrees in a second case of conditions.

19. The apparatus according to claim 18, wherein the data transition lag the rising edge of said second timing signal transitions by said given phase degree ranges.

20. The apparatus according to claim 1, wherein said arbitrary but fixed phase relationship varies between +90 degrees to +135 degrees or by +270 degrees to +315 degrees in a third case of conditions.

21. The apparatus according to claim 20, wherein the data transition lag the rising edge of said second timing signal transitions by said given phase degree ranges.

* * * * *